(12) United States Patent
Freeman et al.

(10) Patent No.: US 6,829,814 B1
(45) Date of Patent: Dec. 14, 2004

(54) PROCESS OF MAKING AN ALL-SILICON MICROPHONE

(75) Inventors: John E. Freeman, Kempton, IN (US); William J. Baney, Kokomo, IN (US); Timothy M. Betzner, Kokomo, IN (US); Dan W. Chilcott, Greentown, IN (US); John C. Christenson, Kokomo, IN (US); Timothy A. Vas, Kokomo, IN (US); George M Queen, Kokomo, IN (US); Stephen P Long, Tipton, IN (US)

(73) Assignee: Delphi Technologies, Inc., Troy, MI (US)

( * ) Notice: Subject to any disclaimer, the term of this patent is extended or adjusted under 35 U.S.C. 154(b) by 336 days.

(21) Appl. No.: 10/231,325

(22) Filed: Aug. 29, 2002

(51) Int. Cl.[7] .................. H04R 31/00; H04R 25/00; H01L 21/00
(52) U.S. Cl. ................. 29/594; 29/25.42; 29/25.41; 438/33; 438/42; 438/45; 381/170
(58) Field of Search .................. 29/25.41, 25.42, 29/594; 438/33, 42, 45; 381/170, 171, 174, 175

(56) References Cited

U.S. PATENT DOCUMENTS

| | | | | |
|---|---|---|---|---|
| 4,420,790 A | * | 12/1983 | Golke et al. | 361/283.3 |
| 4,670,092 A | * | 6/1987 | Motamedi | 438/52 |
| 5,146,435 A | | 9/1992 | Bernstein | 367/181 |
| 5,343,064 A | * | 8/1994 | Spangler et al. | 257/350 |
| 5,369,544 A | * | 11/1994 | Mastrangelo | 361/283.4 |
| 5,555,448 A | | 9/1996 | Thiede et al. | |
| 5,610,971 A | | 3/1997 | Vandivier | |
| 5,706,565 A | * | 1/1998 | Sparks et al. | 29/25.42 |
| 5,725,729 A | * | 3/1998 | Greiff | 438/50 |
| 6,156,585 A | * | 12/2000 | Gogoi et al. | 438/48 |
| 2001/0015106 A1 | | 8/2001 | Aigner et al. | 73/775 |

* cited by examiner

Primary Examiner—A. Dexter Tugbang
Assistant Examiner—Tai Nguyen
(74) Attorney, Agent, or Firm—Stefan V. Chmielewski

(57) ABSTRACT

A process of forming a capacitive audio transducer, preferably having an all-silicon monolithic construction that includes capacitive plates defined by doped single-crystal silicon layers. The capacitive plates are defined by etching the single-crystal silicon layers, and the capacitive gap therebetween is accurately established by wafer bonding, yielding a transducer that can be produced by high-volume manufacturing practices.

25 Claims, 6 Drawing Sheets

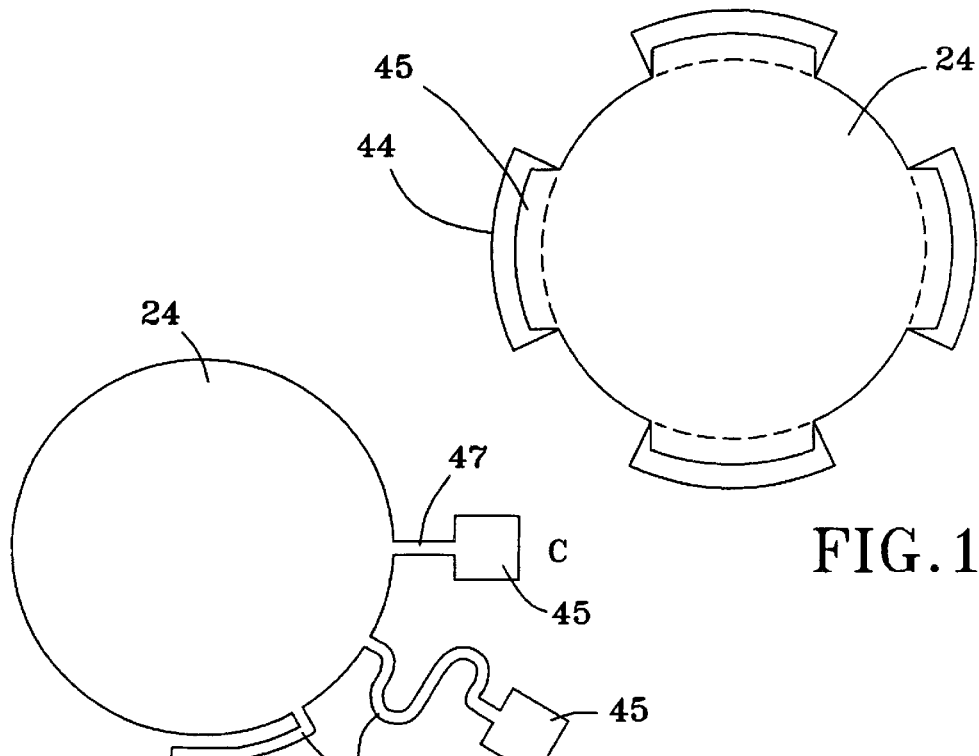
FIG.16
FIG.17
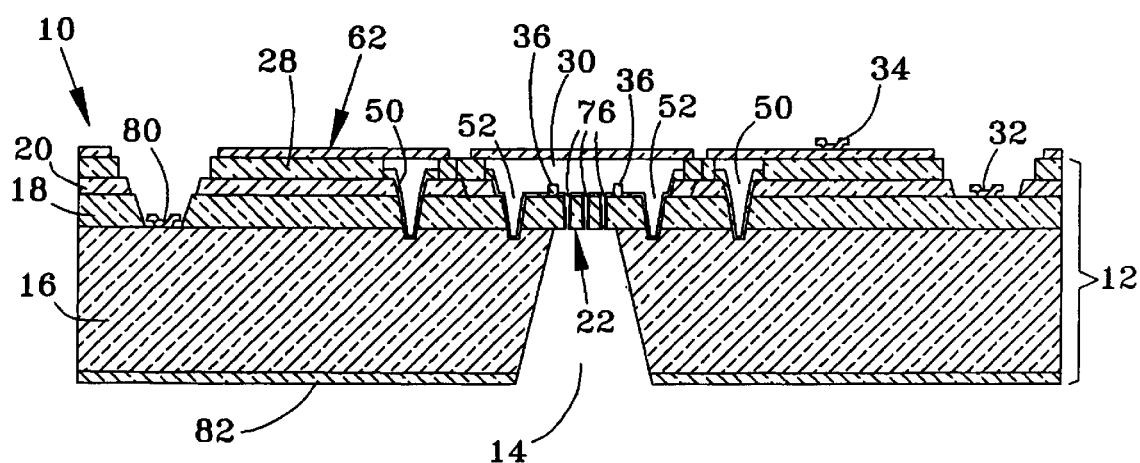
FIG.18

PROCESS OF MAKING AN ALL-SILICON MICROPHONE

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to semiconductor micromachined devices. More particularly, this invention relates to a process of making an all-silicon capacitive microphone, in which a membrane used to sense sound vibration is formed of substantially stress-free single-crystal silicon bonded to a support substrate.

(2) Description of the Related Art

There is a continuing desire for audio devices that are smaller in size, lower in cost, and can be manufactured using high-volume manufacturing practices, yet are characterized by high reliability and sensitivity. An example is acoustic transducers such as microphones that make use of a silicon sensing membrane, examples of which are disclosed in U.S. Pat. No. 5,146,435 to Bernstein, and U.S. Patent Application Publication No. 2001/0015106 to Aigner et al. In both Bernstein and Aigner et al., the silicon sensing membrane is movable and capacitively coupled to a stationary silicon membrane, such that sound waves impinging on the silicon sensing membrane are sensed by changes in the capacitive output of the device.

Processes for fabricating all-silicon microphones of the type disclosed by Bernstein and Aigner et al. are typically long, cumbersome, expensive, and not compatible with high-volume processes. In addition, the silicon sensing membranes can be prone to process-induced deformation and package-induced stresses that can prevent or interfere with proper operation of the device. For example, the silicon membrane disclosed in Aigner et al. is formed of a deposited silicon film and capacitively coupled to a stationary membrane formed of epitaxially-grown silicon. As well known in the art, stresses in deposited films such as the silicon sensing membrane of Aigner et al. are difficult to control, and high temperature steps required to form and process the stationary membrane of Aigner et al. can lead to plastic deformation of surrounding structures, including the silicon sensing membrane. A further disadvantage of capacitive audio devices such as those taught by Bernstein and Aigner et al. is the difficulty with which the distance between the capacitively coupled membranes can be precisely predetermined. For example, the capacitive gap of Bernstein's device is established by the shape of the stationary silicon membrane, while in the device of Aigner et al. the capacitive gap is established by a deposited spacer layer.

In view of the above, there is a continuing need for a process of making a relatively low-cost all-silicon sound transducer that is compatible with high-volume manufacturing practices, yet yields a device characterized by high reliability and performance characteristics.

BRIEF SUMMARY OF THE INVENTION

The present invention is a process of forming a capacitive audio transducer, preferably having an all-silicon monolithic construction that includes capacitive plates defined by doped single-crystal silicon layers. The capacitive plates are defined by etching the single-crystal silicon layers, and the capacitive gap therebetween is accurately established by wafer bonding, yielding a transducer that can be produced by high-volume manufacturing practices, yet is characterized by high reliability and performance characteristics.

The process generally makes use of a first wafer having thereon a first single-crystal silicon layer, which is doped with boron and germanium so as to be p-type. A second p-type single-crystal silicon layer is formed on the first single-crystal silicon layer, and a recess is defined in the second single-crystal silicon layer so as to expose a portion of the first single-crystal silicon layer therebeneath. The portion of the first single-crystal silicon layer exposed by the recess will subsequently define a first capacitor plate of the capacitive audio transducer. A second wafer is provided to have a third single-crystal silicon layer, also doped with boron and germanium so as to be p-type. The first and second wafers are then bonded together so that the recess in the second single-crystal silicon layer defines a cavity between the first and third single-crystal silicon layers of the first and second wafers, respectively. At least portions of the first and second wafers are then removed to expose a portion of the first single-crystal silicon layer defining the first capacitor plate and to expose a portion of the third single-crystal silicon layer, which is spaced apart from the first single-crystal silicon layer by the cavity. The exposed portion of the third single-crystal silicon layer thereby defines a second capacitor plate that is capacitively coupled to the first capacitor plate. One of the first and second capacitor plates is configured to be movable in response to impingement by sound vibrations. Finally, a vent is provided to the cavity through one of the first or third single-crystal silicon layers. A capacitive output signal is produced in response to changes in the distance between the first and second capacitor plates.

From the above, it can be appreciated that the present invention provides an audio transducer characterized by an uncomplicated fabrication process, which can be readily modified to promote both performance and processing characteristics of the transducer. The single-crystal silicon layers that define the first and second capacitor plates are preferably doped to be low stress, and are less prone to process-induced deformation and package-induced stresses than the corresponding structures of prior art all-silicon monolithic audio transducers. Because the single-crystal silicon layers are not deposited films requiring high processing temperatures, the surrounding structures are also less vulnerable to plastic deformation. Another advantage of the invention is that the distance between the capacitive plates is established by the thicknesses of etched layers as a result of the wafer bonding process, enabling the capacitive gap to be precisely predetermined.

Other objects and advantages of this invention will be better appreciated from the following detailed description.

BRIEF DESCRIPTION OF THE DRAWINGS

FIGS. 15 through 17 are plan views of various embodiments for supporting a movable capacitor plate of the transducer shown in FIG. 14.

FIG. 18 shows, in cross-section, an all-silicon monolithic audio transducer in accordance with a second embodiment of this invention.

DETAILED DESCRIPTION OF THE INVENTION

Figure 14:
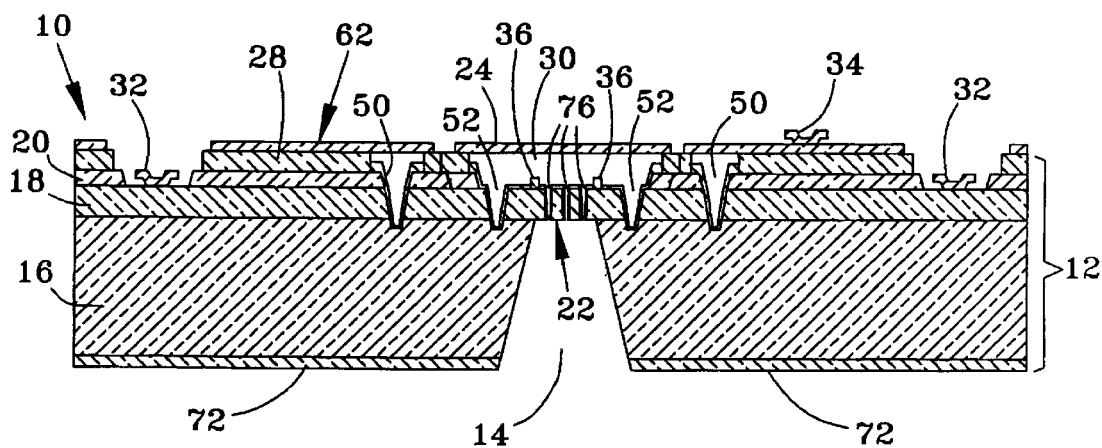

FIG. 14 represents an all-silicon monolithic capacitive-coupled condenser microphone 10 of a type produced by the process of the present invention. As illustrated, the microphone 10 includes a base wafer, referred to as a handle wafer 12, in which a backside cavity 14 has been etched. The handle wafer 12 includes a silicon substrate 16, a doped first epitaxial layer 18, a second epitaxial layer 20, and an insulating film, referred to herein as a bond oxide layer 28, on the epitaxial layer 20. The first epitaxial layer 18 defines a fixed capacitor plate 22 that is spaced apart by a gap 30 from a movable capacitor plate 24, which is defined by a layer 62 of doped single-crystal silicon. The movable capacitor plate 24 is responsive to sound waves relative to the fixed capacitor plate 22. The fixed and movable capacitor plates 22 and 24 are both doped to be electrically conductive, and as a result of being capacitively coupled (as will be discussed below) form the capacitive sensing elements of the microphone 10. A capacitive gap 30 between the fixed and movable capacitor plates 22 and 24 is established by the combined thickness of the epitaxial and oxide layers 20 and 28. Topside bond pads 32 and 34 electrically connected to the epitaxial layers 18 and 62, respectively, provide electrical contacts for the fixed and movable capacitor plates 22 and 24, respectively. Backside contact to the substrate 16 is provided by a metallization 72. The bond pads 32 and 34 enable appropriate circuitry (not shown) to be electrically interconnected with the capacitor plates 22 and 24 through the use of wire bonds, solder bumps, leadframes, or any other conventional technique.

According to a preferred aspect of the invention, the capacitive gap 30 between the fixed and movable capacitor plates 22 and 24 can be precisely controlled as a result of the technique by which the epitaxial and oxide layers 20 and 28 are formed. Capacitive gaps of about five micrometers and less are possible with this invention, with a typical gap 30 being about three micrometers. At such close spacing, the plates 22 and 24 may become permanently stuck together (stiction) as a result of electrostatic forces, particularly if a wet etchant (or another processing liquid) enters the gap 30. Therefore, the microphone 10 preferably includes stiction bumps 36 to prevent stiction and shorting between the capacitor plates 22 and 24.

It is apparent that the relative physical relationships that appear in the Figures are primarily for illustrative purposes and should not be construed as a restriction to the teachings of the present invention. Essentially, the size of the microphone 10 can vary considerably, with alternative processing techniques encompassed by this invention being most efficient if multiple microphones 10 are simultaneously formed from a wafer stack that is subsequently sawed to separate the individual microphones 10.

Figure 1:
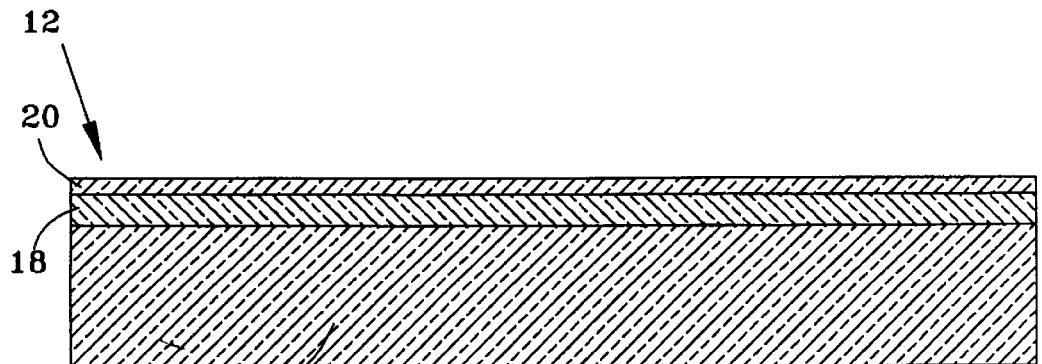
FIGS. 1 through 14 show, in cross-section, processing steps for the manufacture of an all-silicon monolithic audio transducer in accordance with a preferred embodiment of this invention.

Processing steps for the fabrication and assembly of the microphone 10 of FIG. 14 are represented in FIGS. 1 through 13. In FIG. 1, the handle wafer 12 is represented as a single-crystal silicon wafer formed by epitaxially growing the layers 18 and 20 on the substrate 16. As will become apparent, the substrate 16 can be doped to be either p or n-type, though in the preferred embodiment the substrate 16 is lightly doped n-type with phosphorus to achieve a resistivity of about 1 to 100 ohm-centimeters. A suitable thickness for the substrate 16 is about 15 mils (about 0.38 millimeters), though this thickness could vary. The silicon substrate 16 is double-side polished, and the epitaxial layer 18 is preferably heavily doped with boron-germanium (B-Ge). For convenience, the side of the handle wafer 12 that has the B-Ge epitaxial layer 18 will be referred to as the topside of the handle wafer 12. The B-Ge epitaxial layer 18 may have a thickness in the range of about 2.5 to about 5 micrometers, preferably 3 micrometers thick, and will eventually form the capacitor plate 22 of the microphone 10. The relative concentrations of boron and germanium in the epitaxial layer 18 are preferably chosen to minimize stress within the film. While a range of concentrations may be used to achieve low stresses, a preferred embodiment utilizes concentrations of about 1.2 to about $1.5 \times 10^{20}$ (boron atoms per cubic centimeter, and about 1 to about 2 atomic percent germanium, though there are several such combinations that will suffice. According to a preferred aspect of the invention, the ratio of boron and germanium achieved in the epitaxial layer 18 with the above doping levels enables the layer 18 to serve as a silicon etch stop, and also results in the capacitor plate 22 being stress-free or is under a slight tensile stress after processing and release so as not to be prone to membrane buckling.

Figure 2:
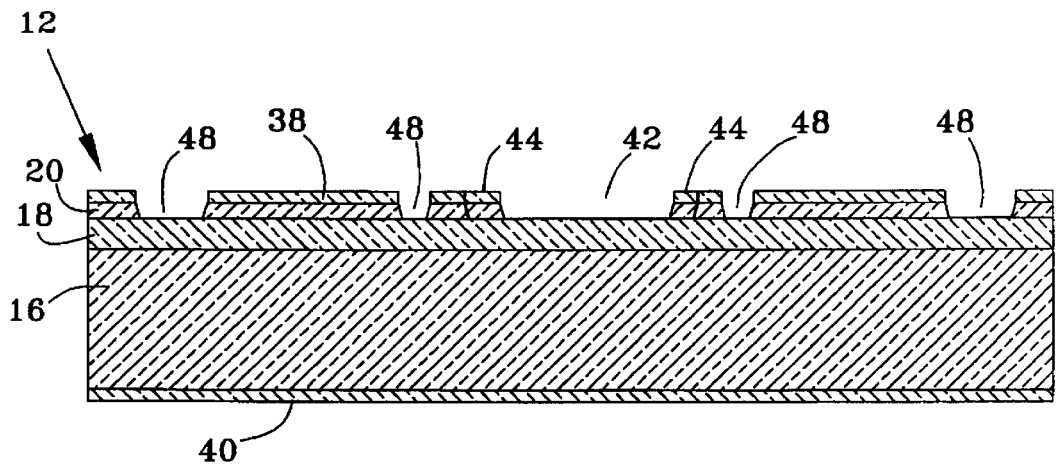

The epitaxial layer 20 is then grown on the B-Ge epitaxial layer 18 using any suitable epitaxy process. The epitaxial layer 20 is p-type silicon (e.g., a boron concentration to achieve a resistivity of about 1.5 ohm-centimeters), and has a thickness of about 0.8 to 2.5 micrometers, preferably about 1.6 micrometers. The handle wafer 12 is then subjected to the additional processing steps represented in FIGS. 2 through 6. In FIG. 2, silicon dioxide (oxide) films 38 and 40 are shown on the epitaxial layer 20 and the backside of the wafer 12 (i.e., opposite the topside), respectively. The oxide films 38 and 40 preferably have thicknesses of about 1000 Angstroms, and may be grown simultaneously on the handle wafer 12 with a thermal treatment at about 850° C. A photoresist process known in the industry is preferably employed to preferentially mask and remove portions of the oxide film 38 using a buffered oxide etch (BOE). The oxide film 40 on the backside of the wafer 12 is protected during etching of the oxide film 38, such as by applying an unpatterned photoresist to the surface of the oxide film 40. The BOE process can then be performed by subjecting the wafer 12 to a hydrofluoric acid (HF) solution to remove the exposed portions of the oxide film 38, selectively exposing portions of the epitaxial layer 20. Alternatively, a dry silicon etch could be substituted for the wet etch. The photomask is then stripped from both sides of the wafer 12, and the wafer 12 is dipped into an HF solution to remove any chemically-grown oxide left on the wafer surfaces by the strip process. Finally, the exposed regions of the epitaxial layer 20 are removed using a silicon etch process of a type known in the industry. Etching proceeds until the B-Ge epitaxial layer 18 is encountered as an etch stop, thereby exposing the layer 18 through windows 42 and 48 defined by the etched regions of the epitaxial layer 20. A dry silicon etch as well as several wet etches may be appropriate for this etch step. A preferred dry etch method uses a deep reactive ion etch (DRIE) process. A suitable wet etch may use hydroxides, including potassium hydroxide (KOH), tetramethyl ammonium hydroxide (TMAH) or ethylenediamine pyrocatechol (EDP), as is known in the art.

In FIG. 2, one of the windows 42 and 48 is shown as being in the form of a recess 42 whose perimeter is defined by multiple peninsulas 44 extending radially inward from the surrounding film 38 and layer 20. Two peninsulas 44 are represented in the cross-sectional view of FIG. 2, with additional peninsulas 44 equally spaced around the perimeter of the recess 42 being preferred. The significance of these peninsulas 44 will be discussed in reference to subsequent processing steps employed by the invention.

Figure 3:
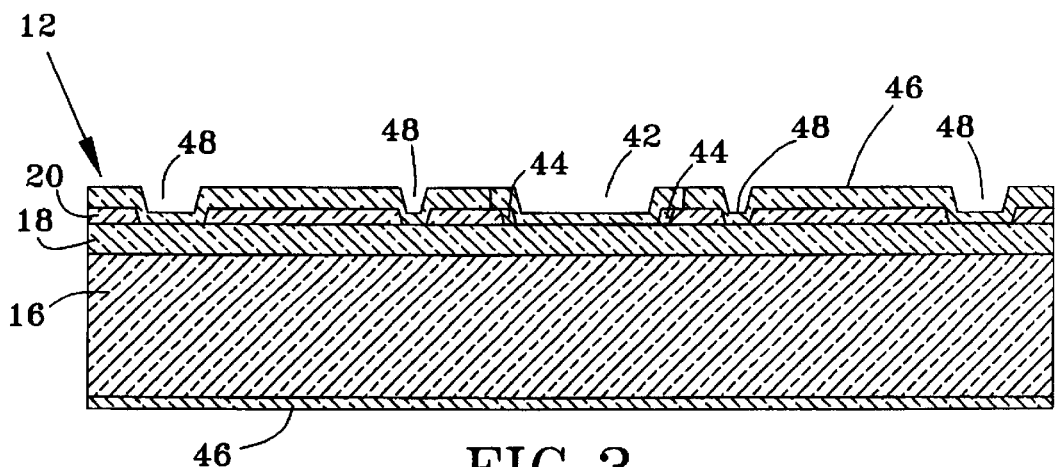
Figure 4:
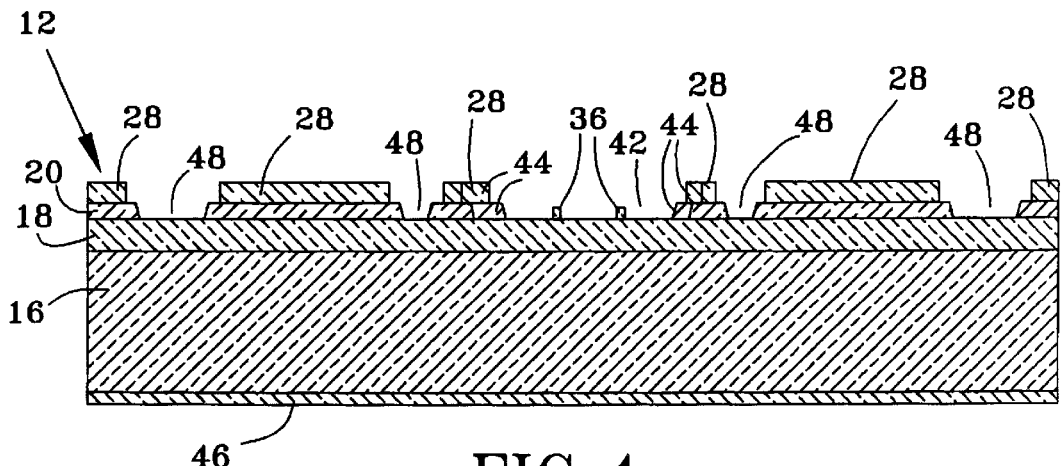

An HF solution is then used to remove the remaining oxide films 38 and 40, after which a thick oxide film 46 is grown on both sides of the handle wafer 12 as shown in FIG. 3. The oxide film 46 on the topside of the handle wafer 12 will be patterned to define the oxide layer 28 of the microphone 10 in FIG. 14. In addition, the oxide film 46 (layer 28) will be used as a bonding oxide, and for this purpose preferably has a thickness of about 8000 to about 26,000 Angstroms, with a preferred thickness being about 24,000 Angstroms. To produce the structure represented in FIG. 4, a photomask (not shown) is applied to both surfaces of the handle wafer 12, and the photomask on the top surface of the wafer 12 is patterned to expose areas of the oxide film 46. Notably, the photomask is patterned to have a shape corresponding to the recess 42 and peninsulas 44 previously defined in the epitaxial layer 20. Within the recess 42, the photomask is patterned so that limited portions or islands of the oxide film 46 are masked. The exposed oxide film 46 is then removed by etching in an HF solution, defining the patterned oxide layer 28 and re-exposing the B-Ge epitaxial layer 18 and surrounding surface regions of the epitaxial layer 20 as shown in FIG. 4. The openings in the oxide layer 28 reestablish the windows 48, and the exposed portions of the epitaxial layer 20 surrounding each window 48 results in the edges of the windows 48, and specifically the edges of the oxide layer 28 defined by the windows 48, being countersunk. Within the recess 42, the masked islands of the oxide film 46 now define the stiction bumps 36 shown in FIG. 14. After the etch mask is removed, the oxide film 46 remains intact on the backside of the handle wafer 12, as represented in FIG. 4.

Figure 5:
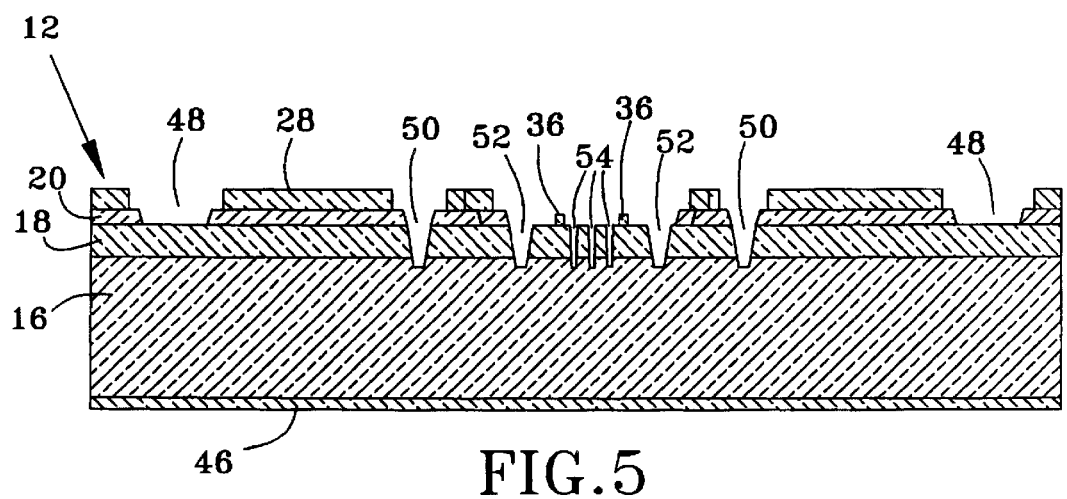
Figure 6:
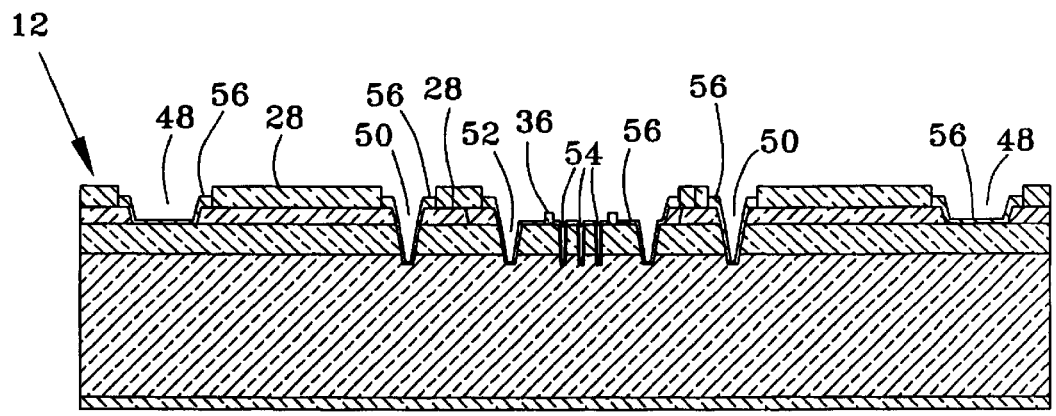

A photomask (not shown) is then applied and patterned on the surface of the wafer 12, exposing selected surface regions of the B-Ge epitaxial layer 18, after which a DRIE etch is performed on the exposed regions of the B-Ge doped epitaxial layer 18 to yield the structure shown in FIG. 5. This etch defines three sets of trenches 50, 52 and 54 that completely penetrate through the B-Ge doped epitaxial layer 18 to the n-type substrate 16 below. The trenches 50 and 52 circumscribe the trenches 54, the latter being essentially holes that will define vents 76 through the capacitor plate 22 (FIG. 14). The trenches 50 and 52 will ultimately provide trench isolation of the capacitor plate 22 from the remainder of the epitaxial layer 18. Once the DRIE etch is complete, the photomask is removed. In FIG. 6, an oxide film 56 has been grown in each of the windows 48 and trenches 50, 52 and 54. A preferred temperature for this oxidation step is about 1050° C. A suitable thickness for the oxide film 56 is in a range of about 800 to about 10,000 Angstroms, with a preferred thickness being about 1000 Angstroms.

Figure 7:
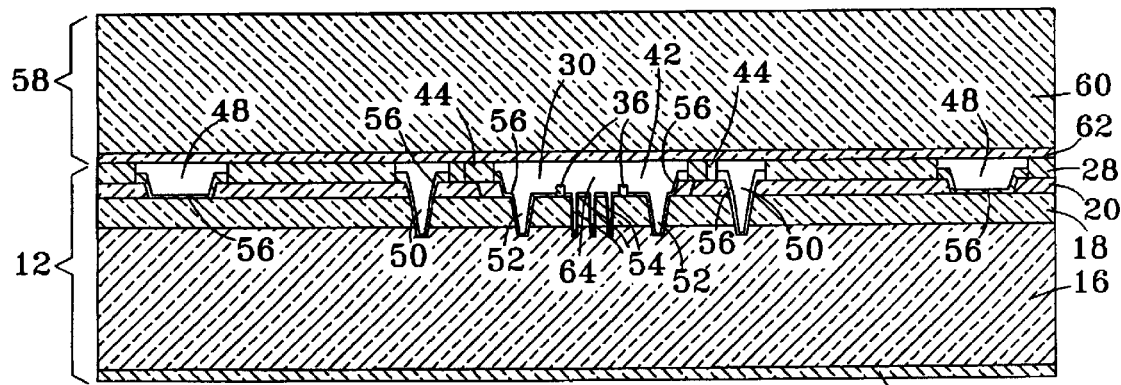
Figure 8:
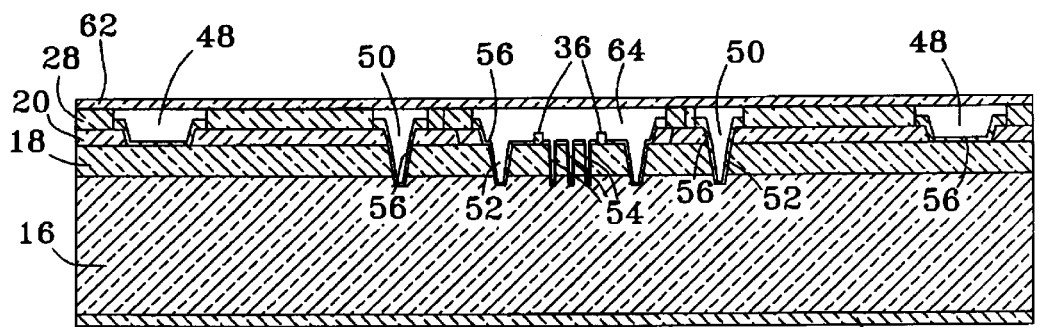

In FIG. 7, a second wafer 58 has been prepared and bonded to the handle wafer 12. The second wafer 58 comprises an N-type silicon substrate 60 having a thickness of about 15 mils (about 0.38 micrometers), though greater and lesser thicknesses are permitted. The wafer 58 can be; single-side polished, though a double-side polished wafer may be used. One surface of the wafer 58 is provided with the doped epitaxial layer 62 (FIG. 14), which has been epitaxially grown to a thickness of about 0.8 to 1.6 micrometers, preferably about 1.0 micrometer. The doped epitaxial layer 62 will be subsequently patterned to define the movable capacitor plate 24 of the microphone 10 in FIG. 14. For this reason, the epitaxial layer 62 is doped to contain a concentration of boron and germanium at levels similar to that of the B-Ge doped epitaxial layer 18, for the same reasons discussed in reference to the epitaxial layer 18. Prior to bonding, the handle and second wafers 12 and 58 are appropriately cleaned as is known in the art, and then mated and bonded, with the oxide layer 28 of the handle wafer 12 contacting the doped epitaxial layer 62 of the second wafer 58. A suitable bonding machine for performing such a process is an Electronic Visions model EV 850. By comparing FIGS. 7 and 14, one can see that the recess 42 that was defined in the handle wafer 12 (FIG. 2) has been enclosed by the doped epitaxial layer 62 as a result of the bonding operation, and will subsequently define the capacitive gap 30 of FIG. 14.

Figure 13:
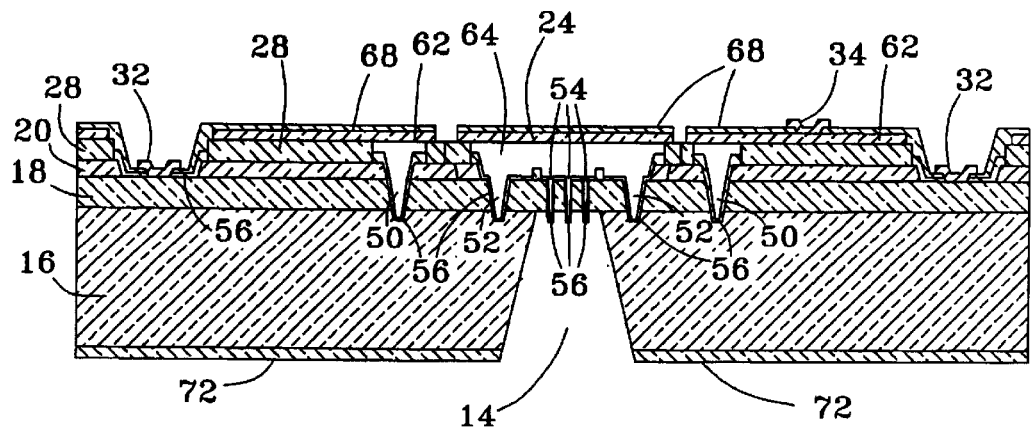

Because the epitaxial layer 20 and the oxide layer 28 are patterned to define peninsulas 44 that extend radially into the recess 42, a longer bond line between the B-Ge doped epitaxial layer 62 and the oxide layer 28 will eventually support the perimeter of the capacitor plate 24 (patterned from the doped epitaxial layer 62 in FIG. 13). In addition, the peninsulas 44 provide for an uninterrupted bond front propagation during the bonding operation, and thus enhance the bond between the oxide layer 28 and the doped epitaxial layer 62 that forms the capacitor plate 24. For this purpose, the peninsulas 44 may have triangular-shapes with rounded apices (FIG. 15), wider at their bases to accommodate the bonding front and narrower at their radially inward extremities. The triangular shape of the peninsulas 44 results in a larger bonded area without altering the operation of the device. The number of peninsulas 44 is important for proper balancing of the microphone 10: $2^N$ peninsulas 44 are advantageous, where N is an integer. As such, two, four, eight or sixteen peninsulas 44 may be advantageously used, with the number being constrained by the geometry and size of the recess 42 and wafer 12. It can be appreciated that a larger number of peninsulas 44 results in a larger bond surface, corresponding to greater adhesion of the capacitor plate 24.

Following bonding, the resulting structure preferably undergoes annealing, such as at about 850° C. in oxygen. An oxide film that grows during the bond anneal step is removed from the un-bonded surfaces of the second wafer 58, after which a portion of the bulk of the wafer 58 is etched away as is known in the industry. A preferred method is to etch a significant portion of the bulk silicon with TMAH, and then use EDP to selectively stop on the B-Ge doped epitaxial layer 62 to yield the structure shown in FIG. 8, in which the recess 42 is now an enclosed cavity 64 between the handle wafer 12 and the B-Ge doped epitaxial layer 62. The portions of the two B-Ge doped epitaxial layers 18 and 62 separated by the cavity 64 define the capacitor plates 22 and 24 of the microphone 10, and the depth of the cavity 64 between the two B-Ge epitaxial layers 18 and 62 establishes the intra-plate spacing for the microphone 10, i.e., the capacitive gap 30 (FIG. 14). The processing conditions during the wafer-to-wafer bond step can be selected so that the cavity 64 contains a vacuum or pressurized gas or air at room temperature. In a preferred process, the cavity 64 is under a vacuum at room temperature.

Figure 9:
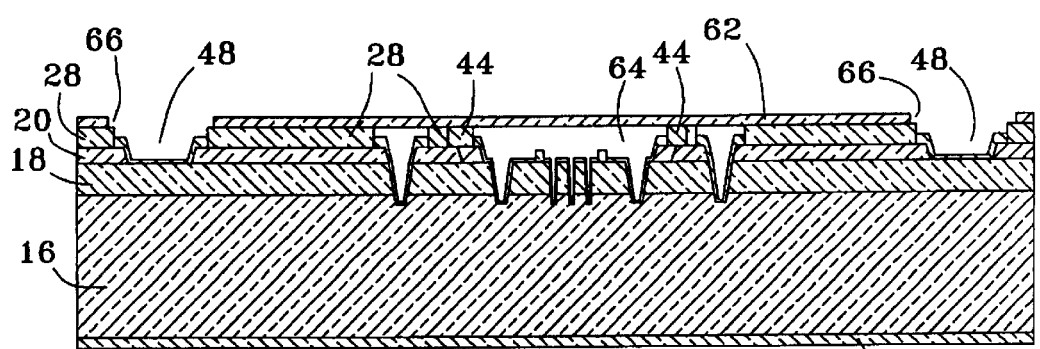
Figure 10:
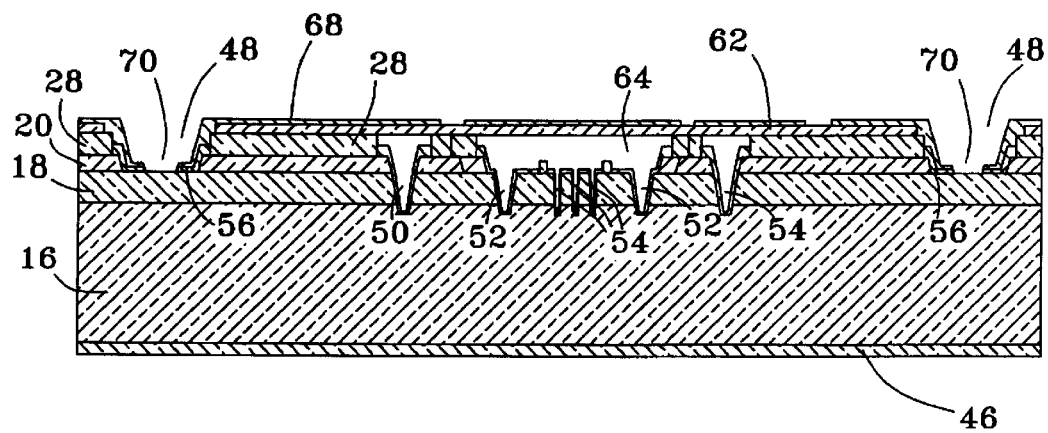

FIG. 9 illustrates the results of forming and patterning a photomask (not shown) on the B-Ge doped epitaxial layer 62, and then performing a dry silicon etch to etch through the B-Ge doped epitaxial layer 62 in the surface regions of the layer 62 exposed by the photomask. Holes 66 formed in the layer 62 reestablish the windows 48 for the bond pads 32 (FIG. 14), and allow topside contact to be made to the various electrically active sublayers of the microphone 10. In FIG. 10, the photomask has been stripped and an oxynitride film 68 (e.g., 2000 to 5000 Angstroms, preferably 3600 Angstroms thick) has been conformally deposited on the exposed topside of the wafer stack, effectively electrically passivating the sidewalls of the pad windows 48. After forming and patterning a photomask (not shown) on the upper surface of the wafer stack, exposed portions of the oxynitride film 68 and the underlying oxide film 56 are etched such that contact windows 70 are delineated for the bond pads 32, as shown in FIG. 10. After stripping the photomask, the topside of the wafer stack is protected, such as with an unpatterned photoresist layer, and the oxide film 46 is removed from the backside of the handle wafer 12 to expose the N-type substrate 16.

Figure 11:
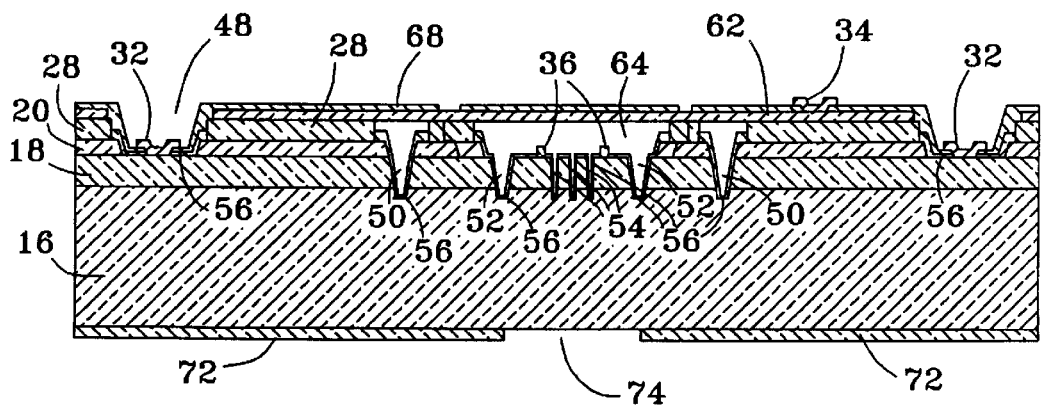

In FIG. 11, a metal film has been deposited and patterned on both surfaces of the wafer stack by any suitable processes known in the art, yielding the bond pads 32 and 34 and a backside metallization 72 with an opening 74 aligned with the cavity 64. The metal film can be patterned by applying and patterning a photomask on the topside and backside surfaces of the wafer stack, and then etching the exposed metal film, such as with a wet metal etchant. The film may be deposited by sputtering, evaporation or other suitable technique, with sputtering being preferred. Suitable materials for the metal film should be adherent to the materials used in the wafer stack, such as the oxynitride film 68, the B-Ge doped epitaxial layers 18 and 62, the N-type silicon substrate 16, and the p-type epitaxial silicon layer 20. In addition, the metal film preferably should exhibit acceptable properties for proper formation of intermetallics during a wire bond process. Several metallic film materials meet these requirements, including but are not limited to gold, aluminum, nickel-gold, chromium-gold, and nickle-chrome-gold, with chromium-gold being preferred.

Figure 12:
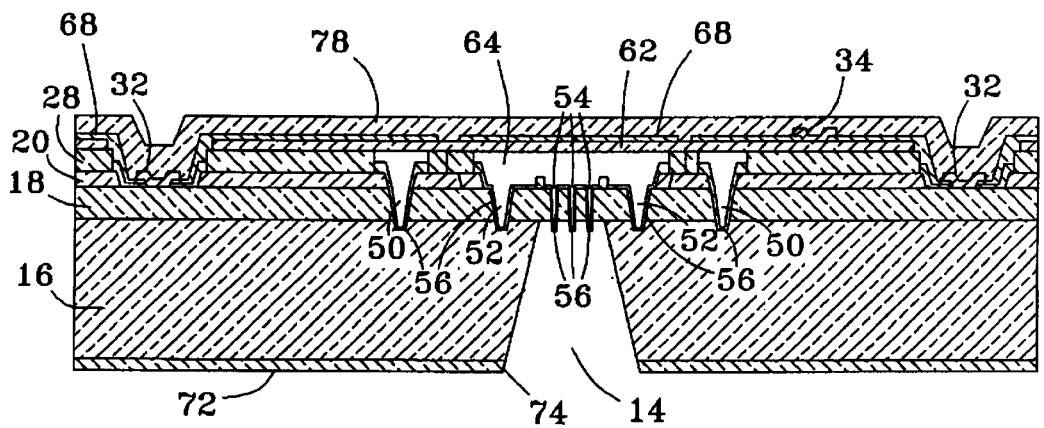

After removing the photoresist, a protective layer 78 is applied to the topside of the wafer stack, and the substrate 16 exposed by the opening 74 is etched to form the backside cavity 14 to result in the structure shown in FIG. 12. Suitable materials for the protective layer 78 include organic and inorganic films, and may be a combination of several different films. Suitable organic films include photoresists, polyimides, BCB's, pocket tape, organic polymers including cyclotene, commercially-available films such as CYTOP, and others known to the industry. Suitable inorganic film materials include deposited nitrides, oxides, oxynitrides, and metals. The backside cavity 14 can be etched into the substrate 16 by etching the bulk of the substrate 16 with a TMAH etchant, followed by an EDP etchant to endpoint the etch on the B-Ge epitaxial layer 18. The oxide films 56 within the trenches 54 are not removed by the EDP etchant, and therefore protrude into the cavity 14 as shown in FIG. 12. The oxide films 56 thus prevent the etchant from entering the cavity 64 between the capacitor plates 22 and 24, which if permitted could damage the plates 22 and 24.

Figure 15:
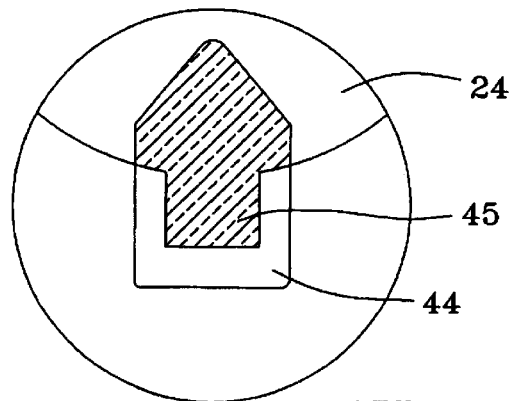

To arrive at the microphone 10 shown in FIG. 14, the protective layer 78 is stripped and the B-Ge doped epitaxial layer 62 is etched to delineate the movable capacitor plate 24, as shown in FIG. 13. This etch can be a dry etch performed using the oxynitride film 68 as a mask, after which the entire oxynitride film 68 can be removed, preferably with a dry etch, though a wet etch could also be used. As large bond areas are generally desirable, FIG. 15 shows how increased bond area between the movable capacitor plate 24 and the peninsulas 44 is achieved by patterning the doped epitaxial layer 62 to have bond tabs 45 that extend radially outward over each of the peninsulas 44. FIG. 16 represents a further enhancement of the bond area, in which the peninsulas 44 and their associated bond tabs 45 have been patterned to be elongate in the circumferential direction of the capacitor plate 24. In practice, long circumferential bond tabs 45 overlapping long circumferential peninsulas 44 as shown in FIG. 16 have been shown to enhance the resilience of the capacitor plate 24. The resilience of the capacitor plate 24 can also be enhanced by narrowing the portion of each tab 45 between the body of the plate 24 and the region of the tab 45 bonded to the peninsula 44, forming what may be termed tethers. Three embodiments of such tethers 47 are shown in FIG. 17 as being shaped to extend radially outward from the plate 24, extend radially outward but have a folded spring configuration, or extend in a generally circumferential direction from the plate 24.

As shown in FIG. 14, the protruding portions of the oxide films 56 remaining within the trenches 54 in FIG. 13 are then removed using an oxide etch process, transforming the trenches 54 into damping holes 76 that vent the enclosed cavity 64 to the backside cavity 14. Dry etching the oxide films 56 desirably results in the oxide films 56 remaining on the walls of the damping holes 76 as a protective layer. Following this etch, the metallization 72 remains on the backside of the wafer stack to serve as a backside contact to the substrate 16.

The process described above produces a microphone 10 with a thin (e.g., about one micrometer-thick) B-Ge silicon diaphragm (movable capacitor plate 24) and a thicker (about three micrometer-thick) B-Ge diaphragm (fixed capacitor plate 22), with the capacitive gap 30 therebetween established by the combined thickness of the epitaxial layer 20 and the bond oxide layer 28 on the handle wafer 12. While the capacitive gap 30 required for the microphone 10 is set by design requirements for operating the microphone 10 within certain specifications, the present method of establishing the gap 30 is significantly more precise than prior art techniques. The isolation trenches 50 and 52 surrounding the capacitor plates 22 and 24 extend down through three layers of the microphone 10, and in the preferred embodiment are vacuum filled, to reduce parasitic capacitance within the device.

It is important to the operation of the microphone 10 that the capacitor plates 22 and 24 defined by the B-Ge doped epitaxial layers 18 and 62 are parallel and flat. As a result of the manufacturing process described above, the B-Ge epitaxial layer 18 is clamped and bonded securely to the substrate 16 of the handle wafer 12, and will remain flat after the etch performed to define the backside cavity 14. The relative concentrations of boron and germanium in the B-Ge doped epitaxial layers 18 and 62 also help to maintain the capacitor plates 22 and 24 parallel and flat as a result of minimizing stresses and/or inducing a small tensile stress in these layers. An added advantage of the doping levels used in the B-Ge doped epitaxial layers 18 and 62 is that they are highly electrically conductive, and therefore may be used for a device level of electrical connectivity. The B-Ge doped epitaxial layers 18 and 62 may be modified to contain carbon for the purpose of inhibiting boron and/or germanium dopant redistribution in the epitaxial layers 18 and 62 during high temperature processing steps (e.g., oxidation). Retarding the movement of boron and germanium in the B-Ge doped epitaxial layers 18 and 62 promotes a well-defined and constant layer thickness throughout processing.

Essentially identical process steps could be employed to switch the locations of the capacitor plates 22 and 24, i.e., form the thinner diaphragm adjacent the backside cavity 14, such that this alternative embodiment is within the scope of the process described above. Other options within the scope of the above embodiment include the use of a hybrid device to attach the capacitor plate 24. In such a device, the capacitor plate 24 is preferably supported by four peninsulas 44 and four tethers 47. Similar to the above discussion regarding the number of peninsulas 44, the hybrid structure is best balanced when the total number of attachment points (number of peninsulas 44 and tethers 47 combined) is $2^N$, where N is an integer. The shaped bonding sites provided by the peninsulas 44 are believed to be important for minimizing stress risers in the B-Ge diaphragms that form the capacitor plates 22 and 24, particularly the thinner capacitor plate 24. As noted previously, the circumferentially-elongated peninsulas 44 shown in FIG. 16 have been demonstrated to achieve significantly higher yields than the triangular-shaped peninsulas 44 of FIG. 15. A wet etch is preferably used to define the peninsulas and pedestals in all embodiments. DRIE is believed to be preferred for forming the tethers, and may also be used to define the peninsulas and pedestals.

The countersunk edges of the windows 48 discussed in reference to FIG. 4 are preferred features of the invention for preventing the formation of oxide risers (raised edges) in the oxide layer 28 that can prevent proper bonding of the handle and second wafers 12 and 58. Other possible methods of minimizing oxide risers include rounding the corners of the windows 48 by making changes to the device layout. For example, when the window corners are in the plane of the surface of the handle wafer 12 (the x-y plane, such that risers form in the z plane), a series of oxidations and strips can be performed to round the corners in the x-z and y-z planes, with less oxide being grown in each cycle to minimize the risers.

In a second embodiment of the invention shown in FIG. 18, a topside contact 80 to the substrate 16 is provided instead of the backside contact formed by the metallization 72. In this embodiment, processing of the handle wafer 12 represented in FIGS. 1 through 3 does not change. At the process level illustrated by FIG. 4, an opening (not shown) is etched in the oxide film 46 on the backside of the handle wafer 12 where the backside cavity 14 will be subsequently formed. The topside of the handle wafer 12 is protected through this etch step. Thereafter, etching of the trenches 50, 52 and 54 can proceed as described above in reference to FIG. 5. During the oxidation step performed to grow the oxide films 56 (FIG. 6), an oxide layer is also grown in the opening that was formed in the backside oxide film 46. This oxide layer may have a thickness in a range of about 800 to 10,000 Angstroms, preferably about 2500 Angstroms.

Processing again resumes in accordance with the bonding operation represented in FIG. 7. At the process level illustrated by FIG. 7, the 2500 Angstrom oxide layer in the opening of the oxide film 46 is removed. An etch mask is provided on the backside of the wafer 12, covering the wafer surface including the opening in the oxide film 46 (where the cavity 14 will be defined), and the bulk silicon etch is started on the exposed substrate 60 of the wafer 58. After a significant amount of layer 60 is etched, the etch mask on the backside of the wafer 12 is removed, and the wafer stack is returned to the etchant. A portion of the backside cavity 14 is then defined by etching the exposed portion of the substrate 16 at the same time that the rest of the substrate 60 is being etched. The etch of the cavity 14 is not completed during this step, though all of the substrate layer 60 is completely etched away to expose the layer 62. Because a portion of the substrate 16 remains between the partial cavity 14 and the trenches 54, the trenches 54 (which will define the holes 76 when the cavity 14 is completed) are not exposed to the etchant, nor any other solution used during subsequent processing. As such, the walls of the interplate cavity 64 remains protected during subsequent processing steps. The backside cavity 14 is completed later, as will be discussed below. To perform the etching steps described above, TMAH is preferably used to initially etch both substrates 16 and 60, after which EDP is used to selectively stop on the B-Ge doped epitaxial layer 62. The result is the structure shown in FIG. 8, altered by the presence of a portion of the backside cavity 14.

Following the process level corresponding to FIG. 10, and prior to deposition of the metal film that forms the contacts 32 and 34 and the backside metallization 72, the topside surface of the wafer stack is masked and patterned, followed by etching to extend the lefthand window 48 (as viewed in FIG. 10) through the epitaxial layer 18. During this step, the righthand window 48 is masked. The metal film discussed in reference to FIG. 11 is then deposited and patterned to simultaneously form the righthand contact 32, the contact 34, and the contact 80 shown in FIG. 18. As a result of the topside contact 80, the backside contact 72 in FIGS. 11 through 14 is not required in this embodiment. In its place, an oxide layer 82 shown in FIG. 18 is preferably formed. The backside cavity 14 is completed with the etch performed in reference to FIG. 12. During this etch, the interior surface of the capacitor plate 22 is protected by the oxide film 56.

A notable feature of the second embodiment of this invention is that the backside cavity 14 is not completed until the very end of processing, such that the remaining portion of the substrate 16 serves as a dam that prevents etchants and other processing liquids from entering the cavity 64 (capacitive gap 30) between the plates 22 and 24. As previously noted, the exclusion of liquids from the capacitive gap 30 is important to avoid stiction, which can occur when very smooth, closely-spaced surfaces (e.g., the opposing surfaces of the plates 22 and 24) come into contact with each other. Furthermore, any liquids within the cavity 64 or capacitive gap 30 can expand when the wafer stack is heated, e.g., contacts a hot plate during a photolithographic step. The expansion of a liquid trapped within the cavity 64 could potentially burst one of the capacitor plates 22 and 24, or form and burst a bubble in the photoresist applied to protect the vent holes 76. Though very thin, the capacitor plate 24 is substantially opaque, such that a proper backside alignment is used to locate the backside cavity 14, instead of attempting a front side alignment through the plate 24. Alternatively, an infrared alignment technique could be used to see through the plate 24.

Finally, a third embodiment within the scope of this invention is similar to the second embodiment, in that the backside cavity 14 is not completed until the very end of processing. Processing to produce the backside cavity 14 can proceed in the same manner as described for the second embodiment. The third embodiment differs from both of the first and second embodiments by omitting the oxide film 56 on the interior surfaces of the capacitor plate 24 and the trenches 54, and increases process simplicity.

While the invention has been described in terms of several embodiments, other forms could be adopted by one skilled in the art. Accordingly, the scope of the invention is to be limited only by the following claims.

What is claimed is:

1. A process of forming a capacitive audio transducer, the process comprising the steps of:
    providing a first wafer having a substrate and a first single-crystal silicon layer doped with boron and germanium so as to be p-type;
    forming on the first single-crystal silicon layer a second single-crystal silicon layer;
    forming a recess in the second single-crystal silicon layer so as to expose a portion of the first single-crystal silicon layer, the portion of the first single-crystal silicon layer defining a first capacitor plate of the capacitive audio transducer;
    providing a second wafer having a substrate and a third single-crystal silicon layer doped with boron and germanium so as to be p-type;
    bonding the first and second wafers together so that the recess in the second single-crystal silicon layer defines a cavity between the first and third single-crystal silicon layers; and
    removing at least portions of the substrates of the first and second wafers to expose a portion of the first single-crystal silicon layer defining the first capacitor plate and to expose a portion of the third single-crystal silicon layer that is spaced apart from the first single-crystal silicon layer by the cavity, the portion of the third single-crystal silicon layer defining a second capacitor plate that is capacitively coupled to the first capacitor plate of the capacitive audio transducer, one of the first and second capacitor plates being movable in response to impingement by sound vibrations;
    wherein a capacitive output signal is produced in response to changes in the distance between the first and second capacitor plates that occur as a result of sound-induced vibration.

2. A process according to claim 1, wherein the first and third single-crystal silicon layers are epitaxially grown on the first and second wafers, respectively.

3. A process according to claim 1, wherein the third single-crystal silicon layer is formed on the second wafer to be thinner than the first single-crystal silicon layer on the first wafer, and the second capacitor plate is movable in response to impingement by sound vibrations.

4. A process according to claim 1, wherein the removing step comprises etching through the substrate of the first wafer to define a cavity that exposes the first single-crystal silicon layer, and using the first single-crystal silicon layer as an etch stop as a result of the boron and germanium content therein.

5. A process according to claim 1, wherein the removing step comprises etching through the substrate of the second wafer and using the third single-crystal silicon layer as an etch stop as a result of the boron and germanium content therein.

6. A process according to claim 1, further comprising the step of forming stiction bumps within the recess following the step of forming the recess in the second single-crystal silicon layer.

7. A process according to claim 1, wherein the step of forming the recess in the second single-crystal silicon layer simultaneously produces accesses for electrical contact to the first single-crystal silicon layer through the second single-crystal silicon layer.

8. A process according to claim 7, wherein the step of forming the recess in the second single-crystal silicon layer comprises a deep reactive ion etch technique.

9. A process according to claim 1, further comprising the step of providing a vent to the cavity through the first single-crystal silicon layer, a first portion of the vent being formed by etching through the first single-crystal silicon layer after the step of forming the recess in the second single-crystal silicon layer and before the bonding step.

10. A process according to claim 9, wherein the step of forming the first portion of the vent comprises a deep reactive ion etch technique.

11. A process according to claim 9, wherein a second portion of the vent is formed when removing the portion of the substrate of the first wafer to expose the portion of the first single-crystal silicon layer defining the first capacitor plate.

12. A process according to claim 9, further comprising the steps of:

forming an oxide layer on surfaces of the vent before the bonding step;

exposing a portion of the oxide layer during the step of removing the portion of the first wafer; and then breaching the oxide layer to open the vent.

13. A process according to claim 9, wherein the first portion of the vent is etched by deep reactive ion etching, and at least one isolation trench that circumscribes the vent is simultaneously formed during deep reactive ion etching of the vent, the isolation trench extending down through the first and second single-crystal silicon layers and into the substrate of the first wafer.

14. A process according to claim 1, further comprising the step of, before the bonding step, forming an oxide layer on the second single-crystal silicon layer, wherein during the bonding step the oxide layer is bonded to the third single-crystal silicon layer of the second wafer.

15. A process according to claim 14, further comprising the step of patterning the oxide layer to define peninsula-shaped oxide regions surrounding and extending toward the recess in the second single-crystal silicon layer, wherein during the bonding step the oxide layer and the oxide regions are bonded to the third single-crystal silicon layer of the second wafer.

16. A process according to claim 15, wherein the step of patterning the oxide layer causes the peninsula-shaped oxide regions to have a triangular shape whose width narrows toward the recess.

17. A process according to claim 15, wherein the step of patterning the oxide layer causes the peninsula-shaped oxide regions to have an elongate shape extending circumferentially along the perimeter of the recess.

18. A process according to claim 15, wherein the step of removing at least portions of the substrates to expose a portion of the third single-crystal silicon layer and define the second capacitor plate comprises patterning the second capacitor plate to have tabs that project radially outward from the second capacitor plate and are bonded to the peninsulas.

19. A process according to claim 14, further comprising the step of patterning the oxide layer to produce countersunk accesses in the oxide layer for electrical contact to the first single-crystal silicon layer through the second single-crystal silicon layer.

20. A process according to claim 14, wherein the combined thickness of the oxide layer and the second single-crystal silicon layer establishes the distance between the first and second capacitor plates.

21. A process according to claim 1, wherein the second single-crystal silicon layer is more lightly doped than the first single-crystal silicon layer.

22. A process according to claim 1, wherein the removal of the portion of the substrate of the first wafer to expose the portion of the first single-crystal silicon layer is performed in a single etching step subsequent to the removal of the portion of the second wafer.

23. A process according to claim 1, wherein the removal of the portion of the substrate of the first wafer to expose the portion of the first single-crystal silicon layer comprises first and second etching steps in which the portion of the first single-crystal silicon layer is exposed only at the completion of the second etching step, the first etching step being performed simultaneously with removal of the portion of the substrate of the second wafer.

24. A process according to claim 1, wherein the removal of the portion of the substrate of the second wafer to expose the portion of the third single-crystal silicon layer includes moving the entire substrate of the second wafer and comprises first and second etching steps in which the portion of the third single-crystal silicon layer is exposed only at the completion of the second etching step.

25. A process according to claim 1, wherein the substrates of the first and second wafers are n-type silicon.

* * * * *